US006682943B2

(12) United States Patent
Durcan et al.

(10) Patent No.: US 6,682,943 B2
(45) Date of Patent: Jan. 27, 2004

(54) METHOD FOR FORMING MINIMALLY SPACED MRAM STRUCTURES

(75) Inventors: D. Mark Durcan, Boise, ID (US); Gurtej Sandhu, Boise, ID (US); Trung T. Doan, Boise, ID (US); Roger Lee, Boise, ID (US); Dennis Keller, Boise, ID (US); Ren Earl, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 365 days.

(21) Appl. No.: 09/842,783

(22) Filed: Apr. 27, 2001

(65) Prior Publication Data

US 2002/0160541 A1 Oct. 31, 2002

(51) Int. Cl.[7] .................................................. H01G 7/06
(52) U.S. Cl. .................................... 438/3; 438/240
(58) Field of Search ........................... 438/238–256, 438/381–399, 3

(56) References Cited

U.S. PATENT DOCUMENTS 5,714,039 A    2/1998  Beilstein, Jr. et al.
5,804,458 A    9/1998  Tehrani et al.
6,174,737 B1   1/2001  Durlam et al.
6,555,858 B1 * 4/2003  Jones et al. .................... 438/3

OTHER PUBLICATIONS

Miller, R. J., "High Density, Planar Metal Lands", IBM Technical Disclosure Bulletin, vol. 23, No. 6, Nov. 1980, pp. 2270–2276.

* cited by examiner

Primary Examiner—Jey Tsai
(74) Attorney, Agent, or Firm—Dickstein Shapiro Morin & Oshinsky LLP

(57) ABSTRACT

A method of forming minimally spaced MRAM structures is disclosed. A photolithography technique is employed to define masking patterns, on the sidewalls of which spacers are subsequently formed to reduce the distance between any of the two adjacent masking patterns. A filler material is next used to fill in the space around the masking patterns and to form filler plugs. The masking patterns and the spacers are removed using the filler plugs as a hard mask. Digit and word lines of MRAM structures are subsequently formed.

54 Claims, 9 Drawing Sheets

METHOD FOR FORMING MINIMALLY SPACED MRAM STRUCTURES

FIELD OF THE INVENTION

The present invention relates to MRAM semiconductor structures and, in particular, to a method of forming minimally spaced MRAM structures.

BACKGROUND OF THE INVENTION

Magnetic random access memories (MRAMs) employ magnetic multilayer films as storage elements. When in use, an MRAM cell stores information as digital bits, which in turn depend on the alternative states of magnetization of thin magnetic multilayer films forming each memory cell. As such, the MRAM cell has two stable magnetic configurations, high resistance representing a logic state 0 and low resistance representing a logic state 1.

A typical multilayer-film MRAM includes a number of bit or digit lines intersected by a number of word lines. At each intersection, a film of a magnetically coercive material is interposed between the corresponding bit line and digit line. Thus, this magnetic material and the multilayer films from the digit lines form a magnetic memory cell which stores a bit of information.

The basic memory element of an MRAM is a patterned structure of a multilayer material, which is typically composed of a stack of different materials, such as copper (Cu), tantalum (Ta), permalloy (NiFe) or aluminum oxide ($Al_2O_3$), among others. The stack may contain as many as ten different overlapping material layers and the layer sequence may repeat up to ten times. Fabrication of such stacks requires deposition of the thin materials layer by layer, according to a predefined order.

FIG. 1 illustrates an exemplary conventional MRAM structure including MRAM stacks 22 which have three respective associated bit or digit lines 18. The digit lines 18, typically formed of copper (Cu), are first formed in an insulating layer 16 formed over underlayers 14 of an integrated circuit (IC) substrate 10. Underlayers 14 may include, for example, portions of integrated circuitry, such as CMOS circuitry. A pinned layer 20, typically formed of a ferromagnetic material, is provided over each of the digit lines 18. A pinned layer is called "pinned" because its magnetization direction does not rotate in the presence of applied magnetic fields.

Conventional digit lines and pinned layers, such as the digit lines 18 and the pinned layers 20 of FIG. 1, are typically formed by a damascene process. Although damascene processes are preferred for copper interconnects, in the MRAM cell context the damascene process poses a drawback, in that there is an overlay of the pinned layer 20 with respect to the digit line 18, which occurs primarily as a result of photoresist misalignment. On FIG. 1, this overlay is illustrated by an overlay distance D, on each side of the digit line 18. Because of technical and processing limitations, conventional damascene processing is unable to produce continuous digit lines and their associated pinned layers.

Another drawback of using conventional damascene process to form the digit lines 18 of an MRAM is the inability of the process to achieve a minimal space or minimum critical dimension CD (FIG. 1) between two adjacent digit lines and, consequently, between two adjacent memory cells. Current values of the minimal space or critical dimension are in the range of 0.20 $\mu$m. However, with increased packing density of MRAM cells, the minimal space must decrease to values of 0.1 $\mu$m, or even as low as 0.05 $\mu$m, and current damascene processing does not afford these values with current 248 nm lithography.

Accordingly, there is a need for an improved method for fabricating MRAM structures, such as pinned layers and digit lines, which are minimally spaced from each other, as well as a method for decreasing the critical dimension between two adjacent MRAM structures formed on an integrated circuit substrate.

SUMMARY OF THE INVENTION

The present invention provides a method for forming minimally spaced MRAM structures, such as pinned layers and underlying digit lines, formed over various underlayers of an integrated circuit substrate. The present invention employs a photolithography technique to define a masking pattern followed by a spacer formation on sidewalls of the masking pattern to define minimally spaced digit line regions on an IC substrate, over which MRAM structures are subsequently formed. The space in between the masking patterns is filled with a filler material that has etch selectivity to the masking patterns and spacers. The masking patterns, the lateral spacers, as well as the insulating material below the masking patterns are then etched using the filler material as a hard mask to define minimally spaced etched digit line regions on which MRAM structures are subsequently formed.

These and other features and advantages of the invention will be more apparent from the following detailed description which is provided in connection with the accompanying drawings, which illustrate exemplary embodiments of the invention.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "metal" is intended to include not only elemental metal, but metal with other trace metals or in various alloyed combinations with other metals as known in the semiconductor art. The term "metal" is also intended to include doped semiconductors and conductive oxides of such metals.

The present invention provides a method for fabricating minimally spaced MRAM structures over a substrate containing portions of integrated circuitry, such as CMOS. The present invention employs an insulating layer over the integrated circuitry, a photolithography technique to define masking patterns over the insulating layer followed by a spacer formation on the sidewalls of the masking patterns to further reduce the distance between any of the two adjacent masking patterns. A filler material is then employed to fill in the space between adjacent masking patterns. The masking patterns as well as the spacers around them and the underlying insulating material are then etched away, using the filler material as a mask, and digit line regions are formed in the etched insulating material on which MRAM structures are subsequently constructed.

Figure 2:
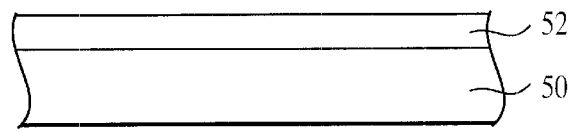
FIG. 2 illustrates a partial cross-sectional view of a semiconductor topography, at an intermediate stage of the processing, wherein an MRAM structure will be constructed in accordance with the present invention.

Referring now to the drawings, where like elements are designated by like reference numerals, FIGS. 2–20 illustrate an exemplary embodiment of a method of forming MRAM structures constructed with minimal space between any of two adjacent MRAM structures. FIG. 2 depicts a portion of a semiconductor substrate 50 on which underlayer 52 has been already formed according to well-known methods of the prior art. The underlayer 52 could include, for example, material layers forming conventional CMOS devices and circuitry.

Figure 3:
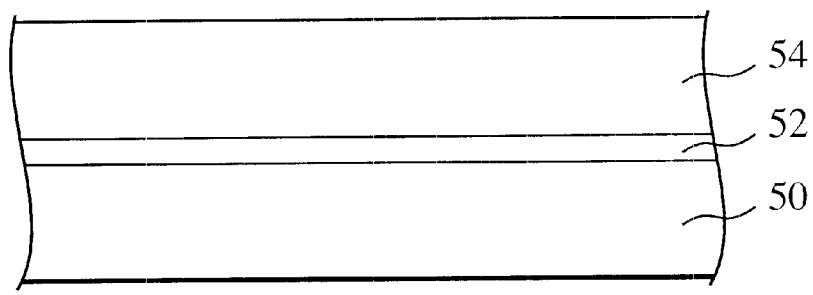
FIG. 3 illustrates a partial cross-sectional view of the MRAM structure of the present invention at a stage of processing subsequent to that shown in FIG. 2.

Referring now to FIG. 3, a first insulating layer 54 is formed overlying the substrate 50 and the underlying layer 52. In an exemplary embodiment of the invention, the first insulating layer 54 is blanket deposited by spin coating to a thickness of about 500 Angstroms to about 10,000 Angstroms. However, other known deposition methods, such as sputtering by chemical vapor deposition (CVD), plasma enhanced CVD (PECVD), or physical vapor deposition (PVD), may be used also in accordance with the characteristics of the IC device already formed. The first insulating layer 54 may be formed of a conventional insulator, for example, a low pressure CVD oxide, a nitride such as $Si_3N_4$, low pressure or high pressure TEOS, or BPSG. Alternatively, a high temperature polymer, such as a polyimide, or a low dielectric constant inorganic material may be employed also.

Figure 4:
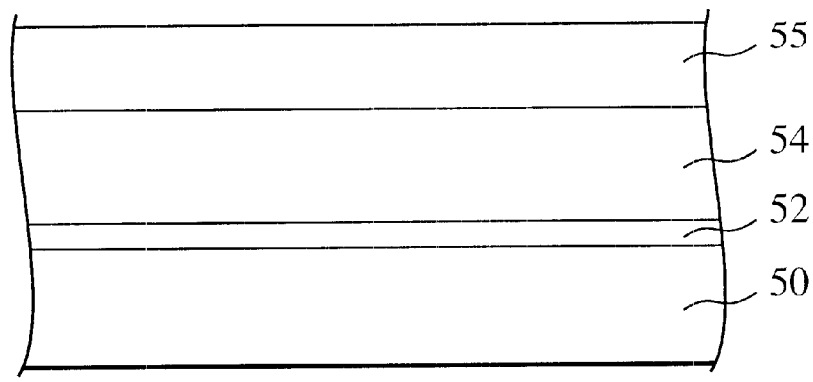
FIG. 4 illustrates a partial cross-sectional view of the MRAM structure of the present invention at a stage of processing subsequent to that shown in FIG. 3.

Following the formation of the first insulating layer 54, a second insulating layer 55 is formed over the first insulating layer 54, as shown in FIG. 4. In an exemplary embodiment of the invention, the second insulating layer 55 is blanket deposited by spin coating to a thickness of about 1,000 Angstroms to about 5,000 Angstroms. However, other known deposition methods, such as sputtering by chemical vapor deposition (CVD), plasma enhanced CVD (PECVD), or physical vapor deposition (PVD), may be used also. The second insulating layer 55 may be formed of a conventional insulator, for example, a low pressure CVD oxide, BPSG, TEOS, or silicon carbide. In any event, the second insulating layer 55 must be formed of a material with etching selectivity different from that of the material forming the first insulating layer 54.

Figure 5:
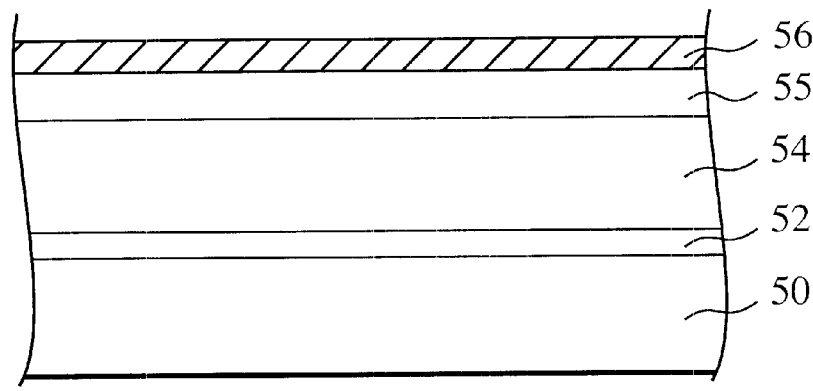
FIG. 5 illustrates a partial cross-sectional view of the MRAM structure of the present invention at a stage of processing subsequent to that shown in FIG. 4.
Figure 6:
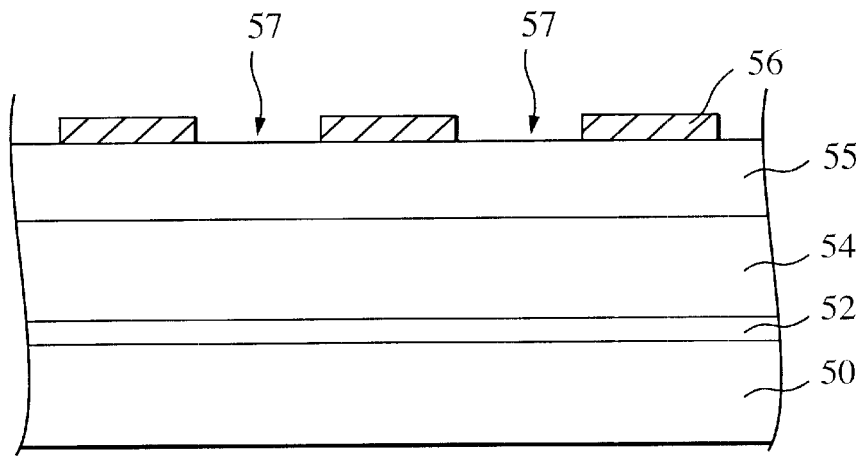
FIG. 6 illustrates a partial cross-sectional view of the MRAM structure of the present invention at a stage of processing subsequent to that shown in FIG. 5.

Next, as illustrated in FIG. 5, a photoresist material layer 56 is formed over the second insulating layer 55. The photoresist material layer 56 is deposited and patterned using conventional photolithography steps. After patterning, initial openings 57 (FIG. 6) are created in the photoresist material layer 56 for subsequent etching of the underlying insulating layers.

Figure 7:
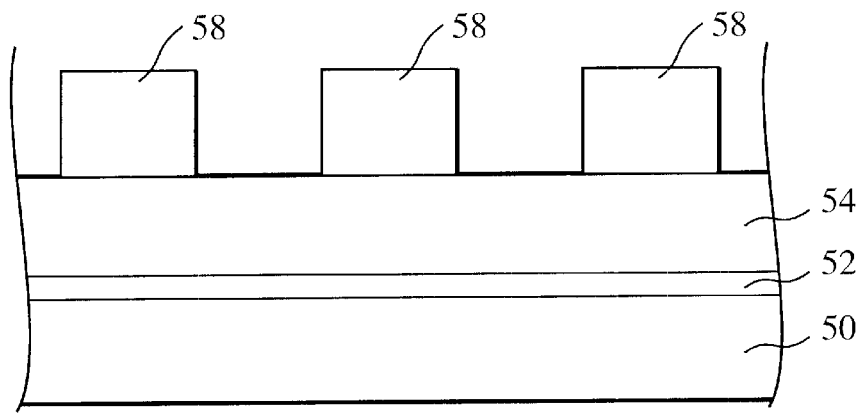
FIG. 7 illustrates a partial cross-sectional view of the MRAM structure of the present invention at a stage of processing subsequent to that shown in FIG. 6.

The second insulating layer 55 is then selectively etched relative to the first insulating layer 54 so that, after removal of the photoresist material layer 56, pillars 58 are formed from the second insulating layer 55, as shown in FIG. 7. To form the pillars 58, the second insulating layer 55 must be etched with an etch process that has a selective etching rate with respect to the first insulating layer 54. For example, if the second insulating layer 55 comprises TEOS, a wet etch such as a 30:1 acetic acid/hydrofluoric acid solution, for example, can be employed to etch the second insulating layer 55 selective to the first insulating layer 54.

Figure 8:
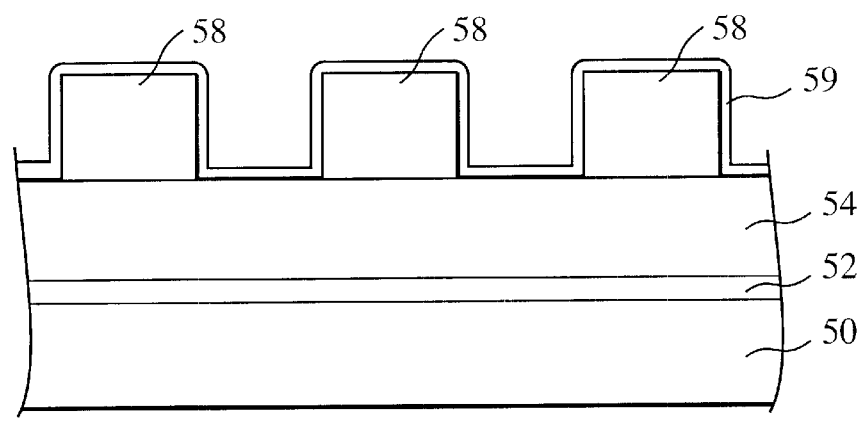
FIG. 8 illustrates a partial cross-sectional view of the MRAM structure of the present invention at a stage of processing subsequent to that shown in FIG. 7.
Figure 9:
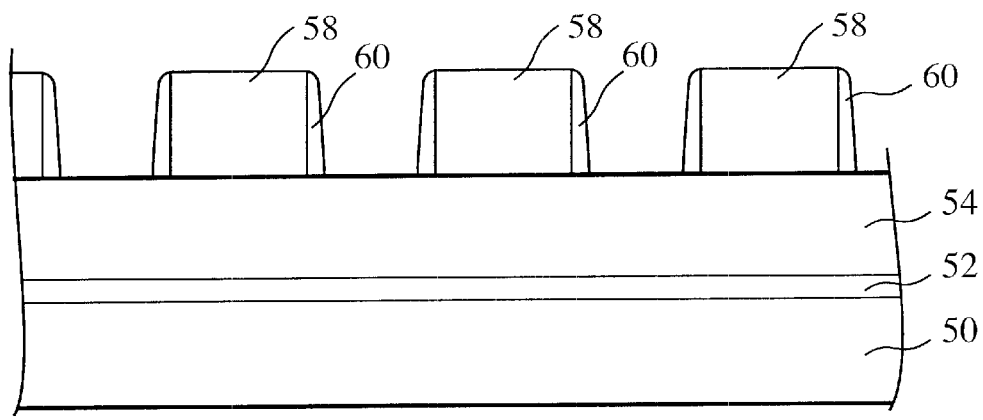
FIG. 9 illustrates a partial cross-sectional view of the MRAM structure of the present invention at a stage of processing subsequent to that shown in FIG. 8.

Upon formation of the pillars 58 (FIG. 7), the next step in the flow process is spacer deposition. In the exemplary embodiment, a nitride spacer is used. As shown in FIG. 8, a silicon nitride ($Si_3N_4$) layer 59 is deposited over the pillars 58 and the first insulating layer 54. The pillars 58 protected by the silicon nitride layer 59 are further subjected to a spacer etch to remove silicon nitride from the surface of the first insulating layer 54 and the top of the oxide pillars 58, leaving spacers 60, as shown in FIG. 9.

Figure 10:
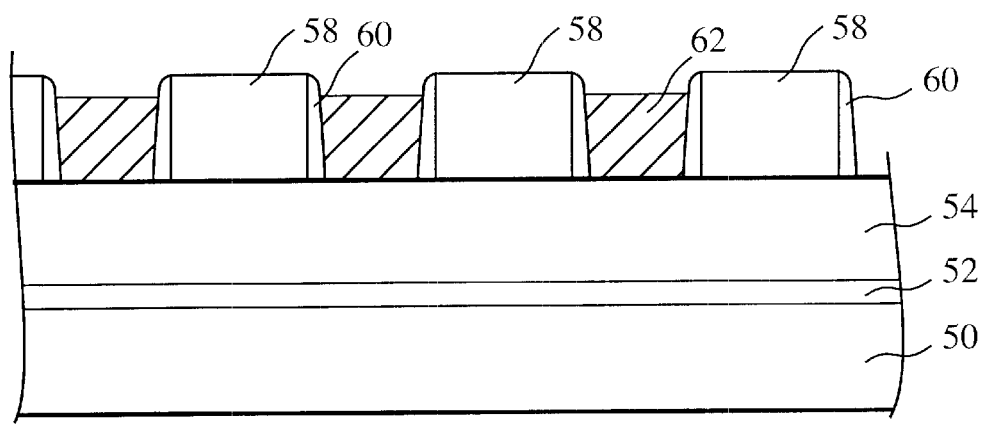
FIG. 10 illustrates a partial cross-sectional view of the MRAM structure of the present invention at a stage of processing subsequent to that shown in FIG. 9.
Figure 11:
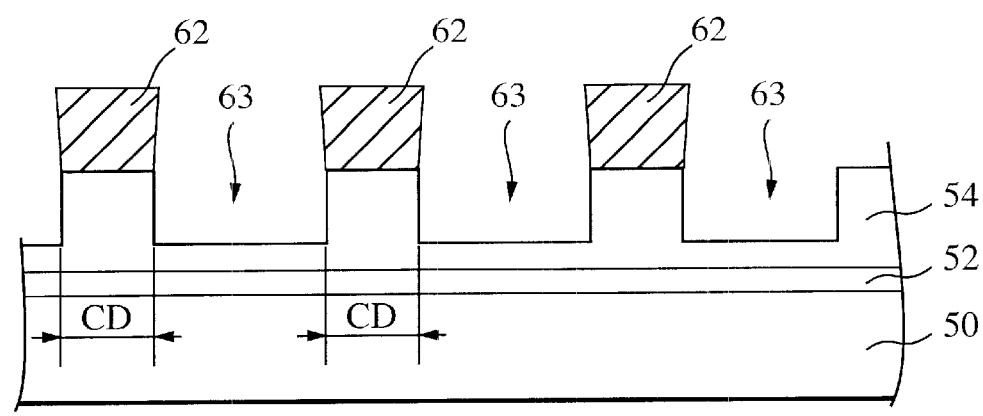
FIG. 11 illustrates a partial cross-sectional view of the MRAM structure of the present invention at a stage of processing subsequent to that shown in FIG. 10.

After formation of spacers 60 (FIG. 9), the space between the pillars 58 is filled with a filler material, for example TEOS, which is subsequently etched back by means of chemical mechanical polishing (CMP) or a well-known RIE dry etching process to obtain filler plugs 62 illustrated in FIG. 10.

Next, the pillars 58, as well as the nitride spacers 60, are etched with an wet etch, for example, that is selective to the filler material of the filler plugs 62. The etching of the pillars 58 continues until portions of the first insulating layer 54 situated below the pillars 58 are etched to form grooves 63 (FIG. 11) with a depth of about 500 Angstroms to about 2,000 Angstroms, more preferably of about 1,000 Angstroms. By employing spacers 60 on pillars 58, the grooves 63 are spaced apart in the first insulating layer 54 at a sub-minimal distance, also called critical dimension CD (FIG. 11), with values lower than 0.25 $\mu$m, preferably lower than 0.1 $\mu$m and, more preferably, lower than 0.05 $\mu$m.

Figure 12:
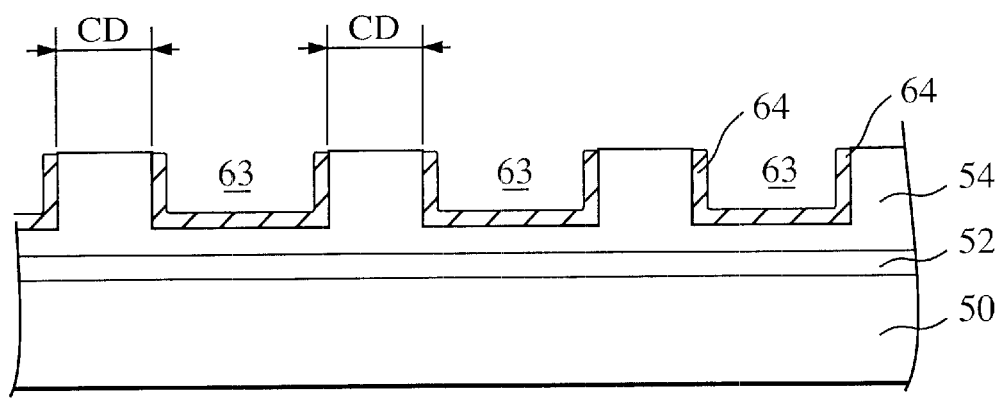
FIG. 12 illustrates a partial cross-sectional view of the MRAM structure of the present invention at a stage of processing subsequent to that shown in FIG. 11.

Subsequent to the formation of the grooves 63 and the removal of the filler plugs 62 with chemicals such as hot acetone or methylethylketone, a thin barrier layer 64 is formed into the grooves 63, as shown in FIG. 12. The barrier layer 64 may comprise bonding materials such as tantalum (Ta), titanium (Ti), titanium-tungsten (TiW), titanium nitride (TiN) or chromium (Cr), among others. The barrier layer 64 forms a strong mechanical and chemical bond between the conductive material which will be formed later and the underlying substrate to help prevent peeling of the formed conductive layer from the insulating layer 54. In a preferred embodiment of the invention, the barrier layer 64 is formed of sputtered tantalum (Ta). In this embodiment, tantalum is deposited to a thickness of about 5 nm to about 10 nm.

Figure 13:
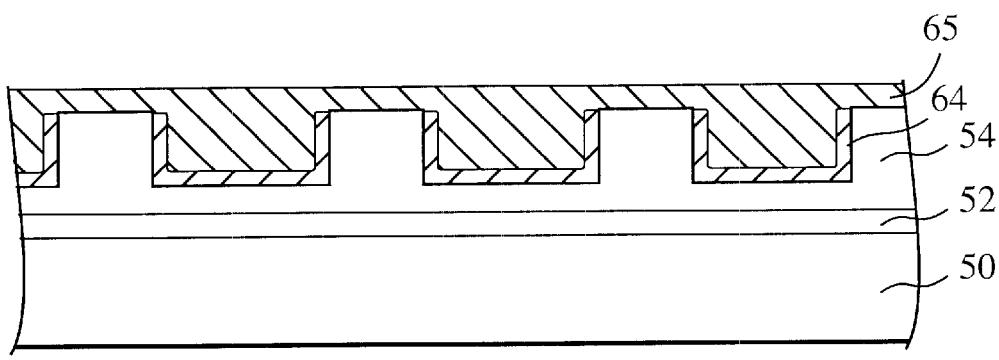
FIG. 13 illustrates a partial cross-sectional view of the MRAM structure of the present invention at a stage of processing subsequent to that shown in FIG. 12.

Next, as illustrated in FIG. 13, a conductive material layer 65 is formed over the barrier layer 64 and the insulating layer 54 to fill in the grooves 63. In a preferred embodiment, the conductive material comprises copper (Cu). However, other conductive materials such as doped polysilicon, aluminum, tungsten or gold, among others, may be used also. Further, metal alloys and conductive metal oxides may be employed also, depending on the desired characteristics of the IC device.

Figure 14:
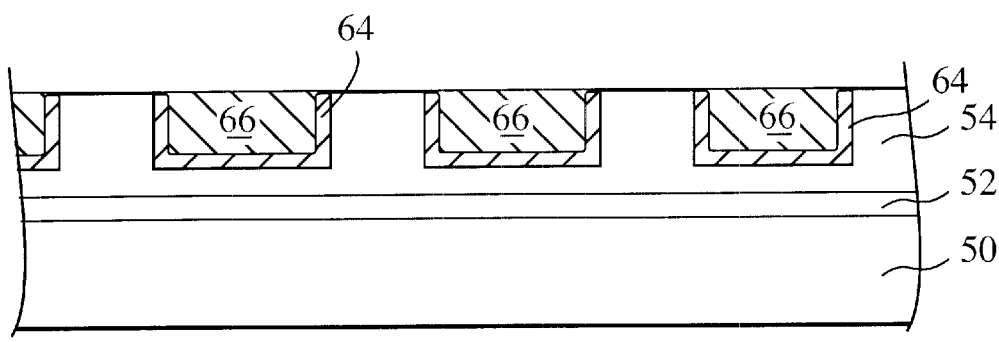
FIG. 14 illustrates a partial cross-sectional view of the MRAM structure of the present invention at a stage of processing subsequent to that shown in FIG. 13.

The conductive material 65, for example, of copper, is formed over the barrier layer 64 by deposition, for example, and then etched back to form metal lines 66 (FIG. 14). In the preferred embodiment of the present invention, the conductive material 65 is etched back by means of chemical mechanical polishing (CMP) or a well-known RIE dry etching process. Either way, the top surfaces of the barrier layer 64 and the metal lines 66 are uniform across the entire surface of the substrate 50, as shown in FIG. 14. The metal lines 66 are minimally spaced from each other by the critical dimension CD. Each metal line 66 will form the bit or digit line of a conventional MRAM structure.

Figure 19:
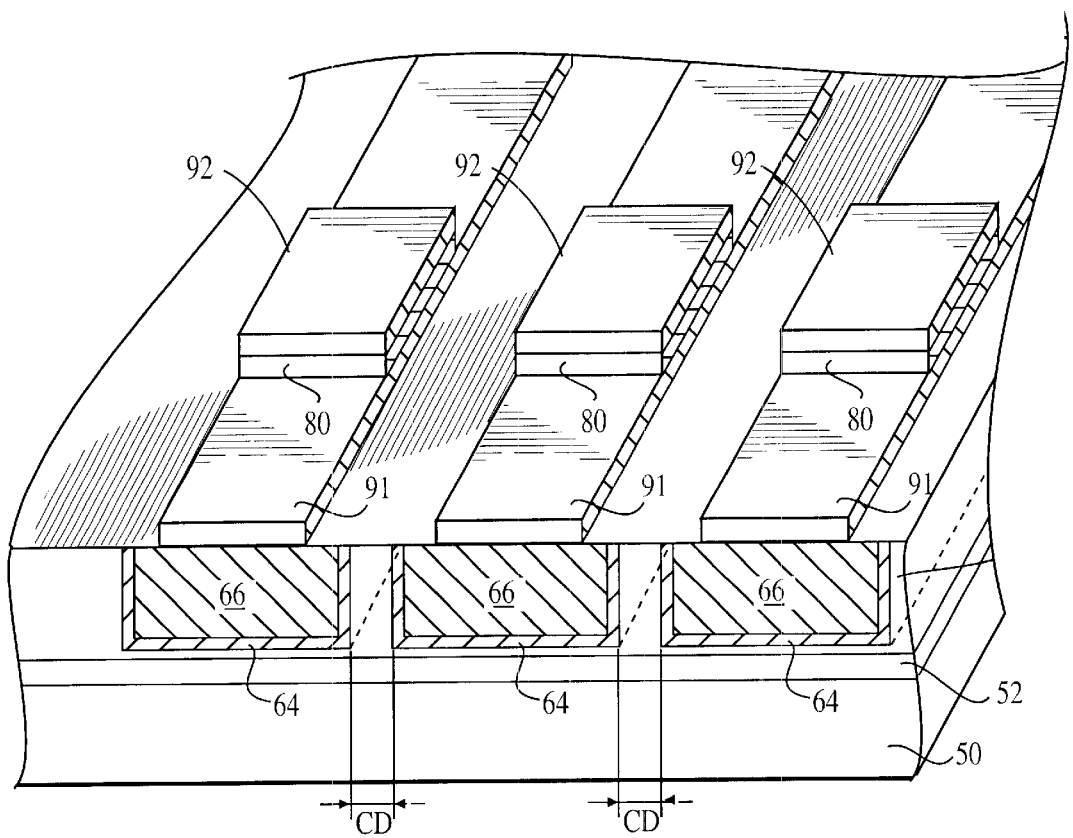
FIG. 19 illustrates a partial three-dimensional view of the MRAM structure of the present invention at a stage of processing subsequent to that shown in FIG. 17.
Figure 20:
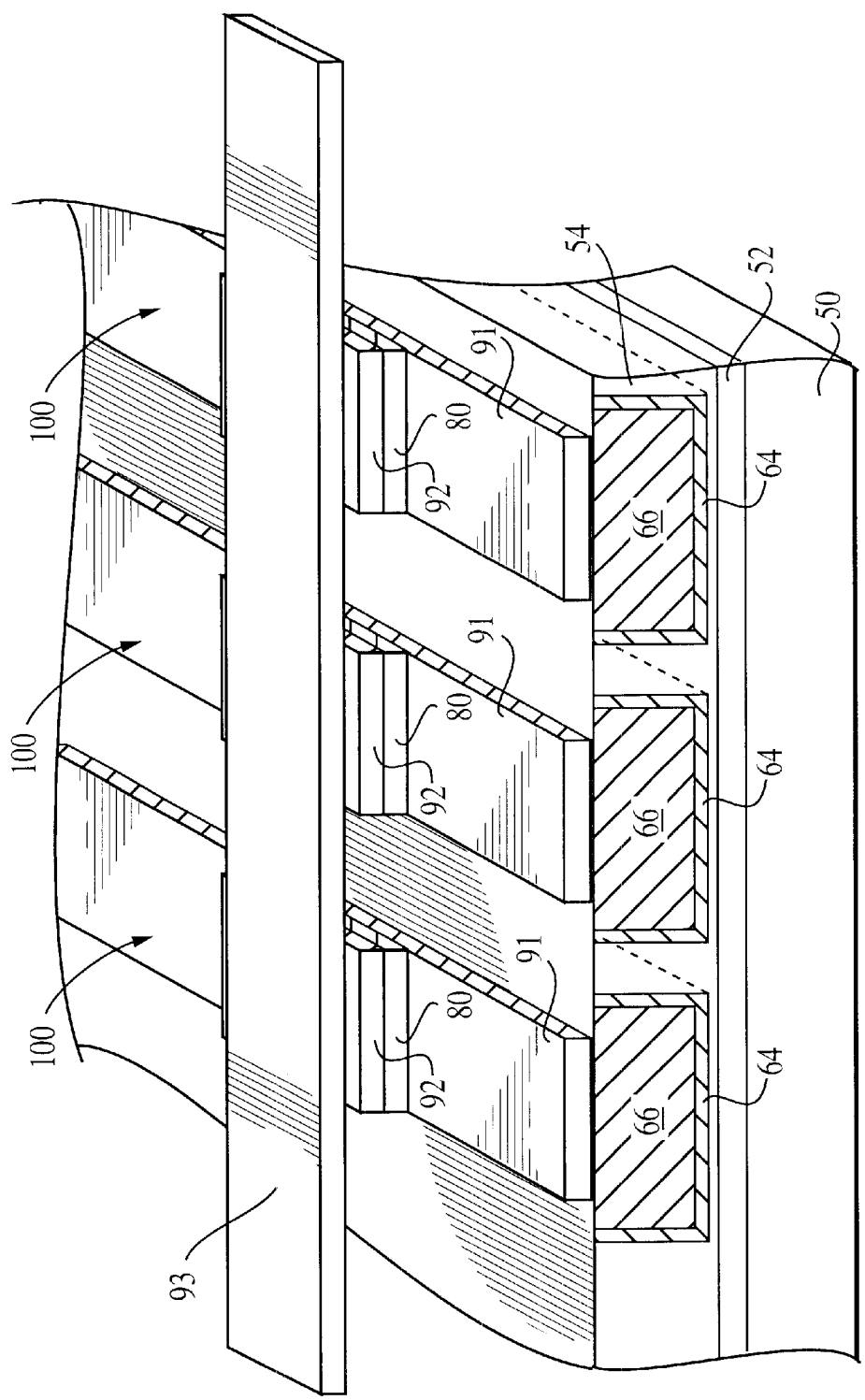
FIG. 20 illustrates a partial three-dimensional view of the MRAM structure of the present invention at a stage of processing subsequent to that shown in FIG. 19.

After the CMP polishing process, the processing steps for the completion of the MRAM structures 100 (FIG. 20) proceed according to known methods of the prior art. As such, a plurality of magnetic multilayer films constituting a first magnetic member 79 (FIG. 15) are first formed over the metal lines 66, which will be later patterned into pinned layers 91 (FIGS. 19–20). The first magnetic member 79 is formed of various material layers, described below in more detail, which are successively blanket deposited over the metal lines 66 and the insulating layer 54, as illustrated in FIG. 15.

Figure 15:
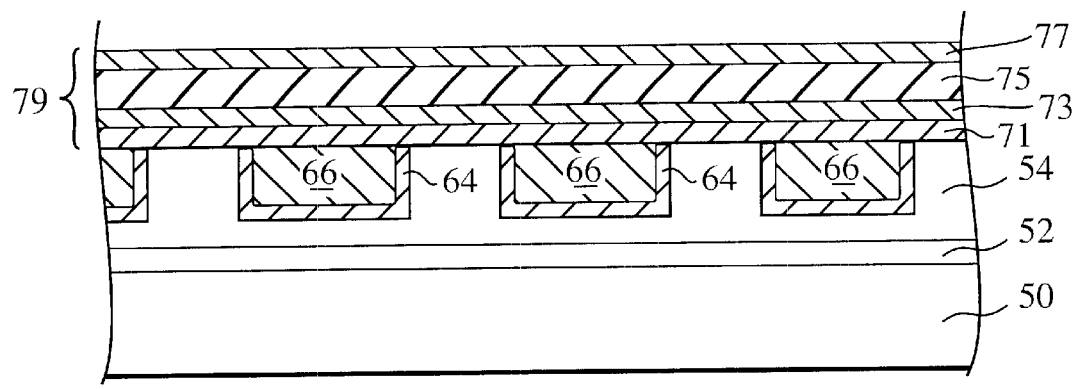
FIG. 15 illustrates a partial cross-sectional view of the MRAM structure of the present invention at a stage of processing subsequent to that shown in FIG. 14.

As such, in an exemplary embodiment of the present invention and as illustrated in FIG. 15, a first tantalum (Ta) layer 71 (of about 20–400 Angstroms thick, more preferably of about 50 Angstroms thick), a first nickel-iron (NiFe) layer 73 (of about 10–100 Angstroms thick, more preferably of about 60 Angstroms thick), a manganese-iron (MnFe) layer 75 (of about 10–100 Angstroms thick, more preferably of about 100 Angstroms thick) and a second nickel-iron (NiFe) layer 77 (of about 10–100 Angstroms thick, more preferably of about 60 Angstroms thick) are successively blanket deposited over the insulating layer 54 and the metal lines 66, to form the first magnetic member 79. Deposition of the layers 71, 73, 75 and 77 may be accomplished by magnetron sputtering, for example. However, other conventional deposition methods may be used also, as desired.

Figure 16:
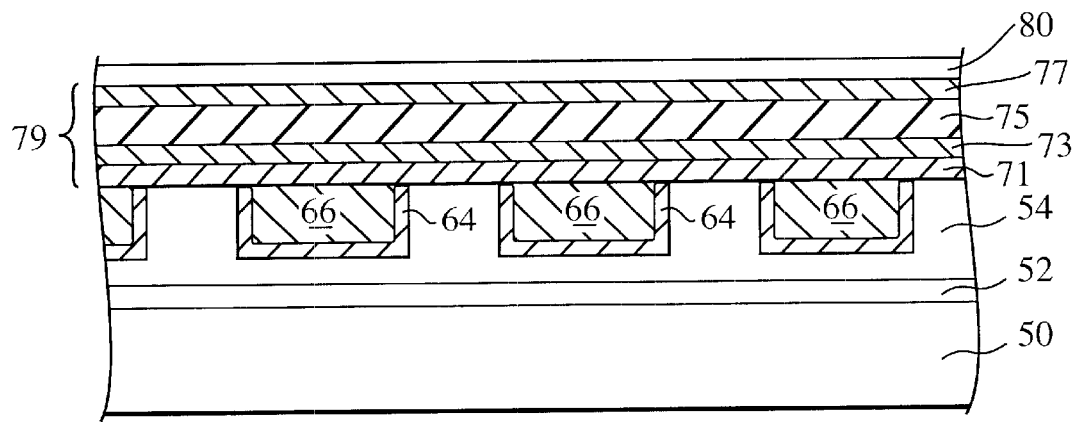
FIG. 16 illustrates a partial three-dimensional view of the MRAM structure of the present invention at a stage of processing subsequent to that shown in FIG. 15.

Following the deposition of the layers 71, 73, 75 and 77, a nonmagnetic, electrically nonconductive layer 80 formed of, for example, aluminum oxide ($Al_2O_3$) (of about 5–25 Angstroms thick, more preferably of about 15 Angstroms thick) is next formed overlying the first magnetic member 79, as shown in FIG. 16. Although aluminum oxide is the preferred material, it must be understood that the invention is not limited to its use, and other non-magnetic materials, such as titanium oxide ($TiO_2$), magnesium oxide (MgO), or silicon oxide ($SiO_2$), or aluminum nitride (AlN), may be used also.

Figure 17:
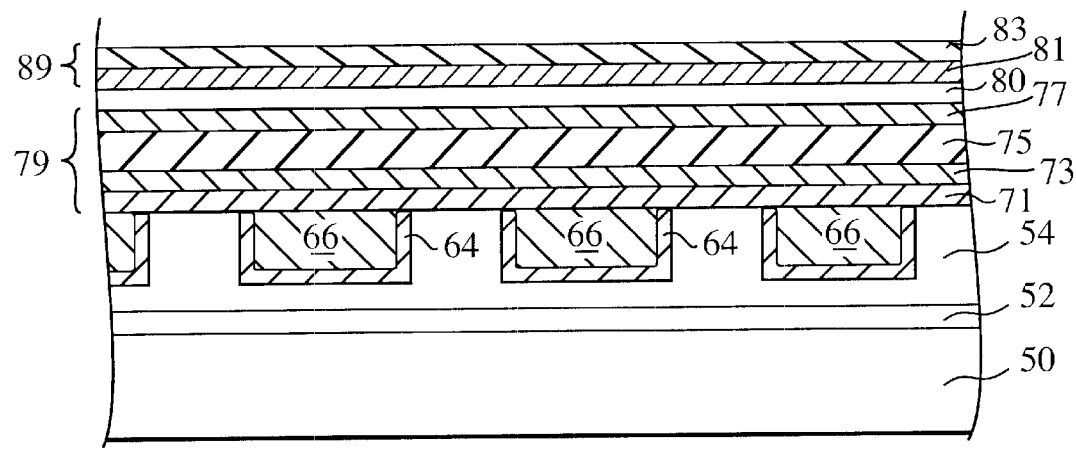
FIG. 17 illustrates a partial three-dimensional view of the MRAM structure of the present invention at a stage of processing subsequent to that shown in FIG. 16.
Figure 18:
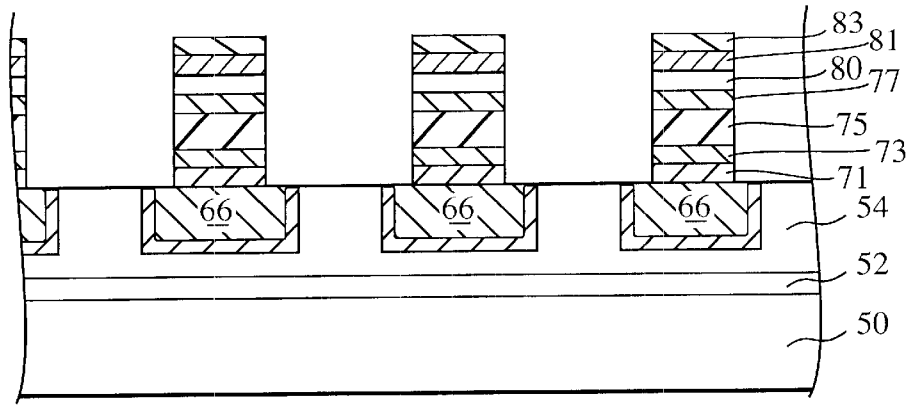
FIG. 18 illustrates a partial three-dimensional view of the MRAM structure of the present invention at a stage of processing subsequent to that shown in FIG. 17.

Referring now to FIG. 17, a plurality of magnetic multilayer films constituting a second magnetic member 89 are next formed over the nonmagnetic layer 80. Accordingly, a third nickel-iron (NiFe) layer 81 (of about 10–100 Angstroms thick, more preferably of about 40 Angstroms thick) and a second tantalum (Ta) layer 83 (of about 20–400 Angstroms thick, more preferably of about 50 Angstroms thick) are successively blanket deposited over the nonmagnetic layer 80, to form the second magnetic member 89, as shown in FIG. 17. Deposition of the layers 81 and 83 may be accomplished by magnetron sputtering, for example, but other conventional deposition methods may be used also, depending on the characteristics of the IC devices constructed previously to the formation of the MRAM structures 100 (FIG. 20).

Next, layers 71, 73, 75, 77, 80, 81, and 83 (FIGS. 15–18) are patterned into a plurality of stacked layers (FIG. 19) including columns of pinned layers 91 and rows and columns of spaced spaced sense layers 92. Thus, each MRAM structure 100 (FIG. 20) includes the pinned layer 91 (as part of the first magnetic member 79) separated from a sense layer 92 (as part of the second magnetic member 89) by the nonmagnetic layer 80. For simplicity, the multilayer stack forming the pinned layer 91 is illustrated in FIGS. 19–20 as a single layer. Similarly, the multilayer stack forming the sense layer 92 is also illustrated in FIGS. 19–20 as a single layer. It must be understood, however, that the pinned layer 91 includes portions of the metal line 66 and of the layers 71, 73, 75 and 77, while the sense layer 92 includes portions of the layers 81 and 83.

Patterning of the plurality of layers forming the pinned and sense layers of the MRAM structures 100 (FIG. 20), that is patterning of layers 71, 73, 75, 77, 80, 81, and 83, may be accomplished by ion milling which typically involves physical sputtering of each layer by an argon ion beam. Patterning may be also accomplished by using a reactive plasma etch, performed, for example, in electron cyclotron resonance (ECR) or other high density plasmas, such as an inductively coupled plasma system, or a helicon plasma system containing chlorine as the source gas. A mixture of chlorine with other gases, such as argon, neon or helium, among others, may be used also.

Figure 1:
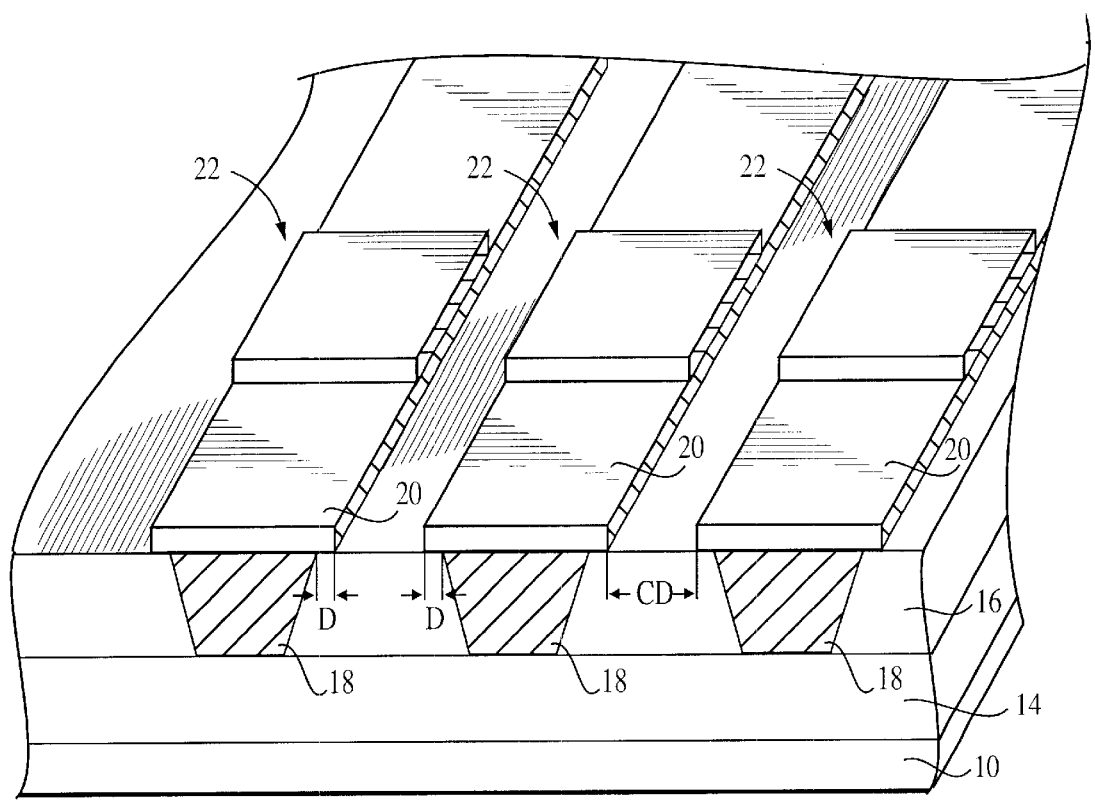
FIG. 1 is a schematic three-dimensional view of a portion of a conventional MRAM structure.

The pinned and sense layers 91, 92 are patterned and etched so that the pinned layers 91 correspond to the metal lines 66 that form the bottom electrodes of the pinned layers 91. This way, the pinned layers 91 of the MRAM structures 100 are spaced apart from each other by a minimal distance or critical dimension CD, less than 0.25 $\mu$m, preferably lower than 0.1 $\mu$m and, more preferably, lower than 0.05 $\mu$m, which was obtained by employing a spacer etch process following a photolithography technique described above with reference to FIGS. 2–11. In addition, the overlay distance D (FIG. 1) on each side of the pinned layer or digit line 91, which characterizes the MRAM structures of the prior art, is eliminated. Further, the present invention allows the formation of continuous metal lines, longer than 2,000 Angstroms, such as the metal lines 66 (FIGS. 14–20), which are necessary for long digit lines and which are not typically achieved by conventional damascene processes.

Additional steps to create a functional MRAM cell may be carried out. Thus, additional insulating layers and write conductors to enable bidirectional current flow in the presence of a write signal may be formed to complete the fabrication process of such MRAM structures. For example, FIG. 20 illustrates three MRAM cell structures 100 formed of a word line 93 that intersects three pinned layers 91 and associated sense layers 92. As known in the art, the word line 93 may be formed of copper, for example, and the space between the word line 93 and the adjacent pinned and sense layers 91, 92 may be filled with an insulating nonconductive oxide, such as aluminum oxide, for example.

Figure 21:
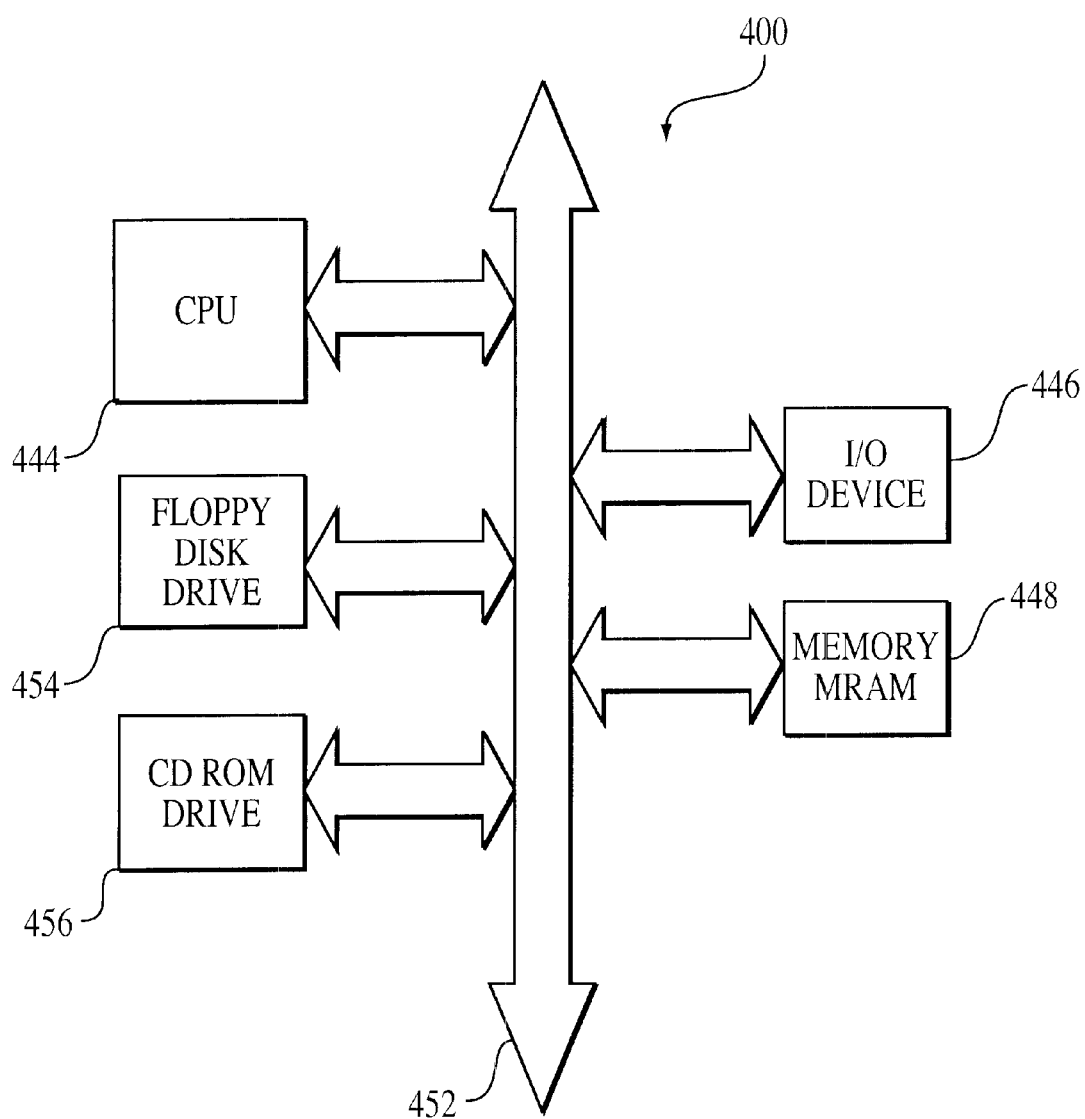
FIG. 21 is a schematic diagram of a processor system incorporating an MRAM structure of the present invention.

A typical processor based system 400 which includes a memory circuit 448, for example an MRAM with MRAM cells 100 (FIG. 20) according to the present invention, is illustrated in FIG. 21. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the CPU 444 over bus 452.

In the case of a computer system, the processor system may include peripheral devices such as a floppy disk drive 454 and a compact disk (CD) ROM drive 456 which also communicate with CPU 444 over the bus 452. Memory 448 may be combined with the processor, i.e. CPU 444, in a single integrated circuit.

Although the exemplary embodiment described above illustrates the formation of three MRAM structures or cells 100 (FIG. 20) it is to be understood that the present invention contemplates the formation of a plurality of MRAM cells 100 arranged in rows and columns in a memory cell array. In addition, although the exemplary embodiments described above refer to a specific topography of the MRAM structures with specific ferromagnetic materials forming such structures, it must be understood that the invention is not limited to the abovementioned ferromagnetic materials, and other ferromagnetics, such as nickel-iron (Permalloy) or iron, among others, may be used also. Further, although the exemplary embodiments described above refer to patterning of the MRAM structures by reactive plasma etching, it must be understood that the present invention contemplates the use of other methods of patterning and etching.

The present invention is thus not limited to the details of the illustrated embodiment. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming at least one magnetic random access memory cell, said method comprising:

forming an insulating layer over a substrate;

forming a mask layer over said insulating layer, said mask layer having a pattern formed of a plurality of first regions containing a mask material and a plurality of second regions which do not contain a mask material, said second regions being located between said adjacent first regions and having a predetermined width between said first regions;

reducing said predetermined width of said second regions by forming a plurality of spacers on sidewalls of each of said first regions;

filling said reduced-width second regions with a filler material to form filler plugs;

removing said first regions and said spacers using said filler plugs as a mask;

forming a plurality of grooves in said insulating layer using said filler plugs as a mask;

forming respective conductive layers in said grooves; and respectively forming at least one first magnetic layer over said conductive layers.

2. The method of claim 1 further comprising respectively forming at least one second magnetic layer over each of said first magnetic layers.

3. The method of claim 2 further comprising forming a word line over said second magnetic layers.

4. The method of claim 1, wherein said act of forming said grooves further comprises etching said insulating layer.

5. The method of claim 4, wherein said etching is a reactive ion etching.

6. The method of claim 1, wherein said act of forming said spacers includes forming a material layer over said first regions and insulating layer and etching said material layer over said insulating layer to produce said spacers on said sidewalls of said first regions.

7. The method of claim 6, wherein said material layer is formed of a nitride.

8. The method of claim 7, wherein said material layer is formed of silicon nitride.

9. The method of claim 1, wherein said act of filling said reduced-width second regions includes placing said filler material in said second regions and over said insulating layer.

10. The method of claim 9 further comprising blanket depositing said filler material in said second regions and then removing said filler material at locations over said first regions and said spacers.

11. The method of claim 1, wherein said act of removing said first regions and said spacers includes etching said first regions and spacers.

12. The method of claim 1, wherein said act of forming said conductive layers further comprises depositing a conductive material inside said grooves.

13. The method of claim 12 further comprising forming a barrier layer before depositing said conductive material.

14. The method of claim 13, wherein said conductive material is copper.

15. The method of claim 1, wherein said act of respectively forming said at least one first magnetic layer further comprises forming each of said respective first magnetic layer as first stacked layers, each of said first stacked layers including at least one layer of magnetic material.

16. The method of claim 15, wherein said magnetic material is selected from the group consisting of nickel-iron, nickel, nickel-iron, iron, and cobalt-iron.

17. The method of claim 16, wherein said first stacked layers include layers of tantalum, nickel-iron and manganese-iron.

18. The method of claim 2, wherein said act of respectively forming said second magnetic layers further comprises forming each of said respective second magnetic layers as second stacked layers, each of said second stacked layers including at least one layer of magnetic material.

19. The method of claim 18, wherein said magnetic material is selected from the group consisting of nickel-iron, nickel, nickel-iron, iron, and cobalt-iron.

20. The method of claim 19, wherein each of said second stacked layers include layers of tantalum and nickel-iron.

21. The method of claim 2 further comprising forming a nonmagnetic layer between said first magnetic layers and said second magnetic layers.

22. The method of claim 21, wherein said nonmagnetic material is formed of a material selected from the group consisting of aluminum oxide, titanium oxide, magnesium oxide, silicon oxide and aluminum nitride.

23. The method of claim 22, wherein said nonmagnetic material is selected from the group consisting of aluminum oxide and copper.

24. The method of claim 1, wherein at least one of said first magnetic layers has a pinned magnetic orientation.

25. The method of claim 2, wherein at least one of said second magnetic layers has a free magnetic orientation.

26. A method of forming a magnetic random access memory structure, said method comprising;
    forming a plurality of pillars over an insulating layer, said pillars defining a plurality of spaces between adjacent pillars, said spaces having a predetermined width;
    reducing said predetermined width of said spaces by forming a plurality of spacers on sidewalls of each of said pillars;
    filling said reduced-width spaces with a filler material to form filler plugs;
    removing said pillars and said spacers using said filler plugs as a mask;
    forming a plurality of grooves in said insulating layer using said filler plugs as mask; and
    forming respective conductive layers in said grooves.

27. The method of claim 26 further comprising the act of forming respective pinned layers over said conductive layers, said pinned layers being spaced apart from each other by less than 0.20 $\mu$m.

28. The method of claim 27, wherein said pinned layers are spaced apart from each other by less than 0.1 $\mu$m.

29. The method of claim 27, wherein said pinned layers are spaced apart from each other by less than 0.05 $\mu$m.

30. The method of claim 27 further comprising the act of forming sense layers over said respective pinned layers.

31. The method of claim 27 further comprising the act of forming a nonmagnetic layer between said pinned layers and respective sense layers.

32. The method of claim 27 further comprising the act of forming a word line over said sense layers.

33. The method of claim 26, wherein said act of forming said grooves further comprises etching of said insulating layer.

34. The method of claim 33, wherein said etching is a reactive ion etching.

35. The method of claim 26, wherein said act of forming said spacers around said pillars includes forming a material layer over said pillars and said insulating layer and etching said material layer to produce said spacers on said sidewalls of said pillars.

36. The method of claim 35, wherein said material layer is a nitride layer.

37. The method of claim 36, wherein said material layer includes silicon nitride.

38. The method of claim 26, wherein said act of filling said reduced-width spaces includes placing said filler material in said spaces and over said insulating layer.

39. The method of claim 38 further comprising the act of blanket depositing said filler material in said reduced-width spaces and then removing said filler material at locations over said pillars and said spacers.

40. The method of claim 26, wherein said act of removing said pillars and said spacers includes etching of said pillars and spacers.

41. The method of claim 26, wherein said act of forming said conductive layers further comprises depositing a conductive material inside said grooves.

42. The method of claim 41 further comprising the act of forming a barrier layer before depositing said conductive material.

43. The method of claim 41, wherein said conductive material is copper.

44. The method of claim 26, wherein said act of forming said pinned layers further comprises forming each of said pinned layers as first stacked layers, each of said first stacked layers including at least one magnetic material.

45. The method of claim 44, wherein said magnetic material is selected from the group consisting of tantalum, nickel-iron, tungsten-nitrogen, nickel, cobalt-nickel-iron, iron, and manganese-iron.

46. The method of claim 30, wherein said act of forming said sense layers further comprises forming each of said sense layers as second stacked layers, each of said second stacked layers including of at least one magnetic material.

47. The method of claim 46, wherein said magnetic material is selected from the group consisting of tantalum, nickel-iron, tungsten-nitrogen, nickel, cobalt-nickel-iron, iron, and manganese-iron.

48. The method of claim 26, wherein said act of forming said plurality of pillars further comprises forming a second insulating material over said insulating layer.

49. The method of claim 48 further comprising etching said second insulating material relative to said insulating layer to form said plurality of pillars.

50. The method of claim 48, wherein said insulating layer is formed of a material selected from the group the group consisting of low pressure CVD oxides, TEOS, and BPSG.

51. The method of claim 48, wherein said insulating layer is formed of a nitride.

52. The method of claim 48, wherein said insulating layer is formed of a high temperature polymer.

53. The method of claim 48, wherein said insulating layer is formed of a low dielectric constant material.

54. The method of claim 48, wherein said second insulating material is formed of a material selected from the group consisting of low pressure CVD oxide, TEOS, BPSG and silicon carbides.

* * * * *